United States Patent [19]

Mahieux et al.

[11] Patent Number: 5,089,818
[45] Date of Patent: Feb. 18, 1992

[54] METHOD OF TRANSMITTING OR STORING SOUND SIGNALS IN DIGITAL FORM THROUGH PREDICTIVE AND ADAPTIVE CODING AND INSTALLATION THEREFORE

[75] Inventors: Yannick Mahieux, Josselin; Alain Charbonnier, Versailles, both of France

[73] Assignee: French State, represented by the Minister of Post, Telecommunications and Space (Centre National D'Etudes Des Telecommunications, Issy Les Moulineaux, France

[21] Appl. No.: 520,200

[22] Filed: May 9, 1990

[30] Foreign Application Priority Data

May 11, 1989 [FR] France .................. 89 06194

[51] Int. Cl.$^5$ .............................................. H03M 3/00
[52] U.S. Cl. ............................................. 341/76; 341/51; 364/485; 375/27
[58] Field of Search ............... 341/76, 77, 51, 143; 375/27, 28, 29, 30, 31; 381/43, 47; 364/726, 485

[56] References Cited

U.S. PATENT DOCUMENTS

| | | | |
|---|---|---|---|
| 4,594,687 | 6/1986 | Kaneko et al. | 364/900 |
| 4,680,797 | 7/1987 | Benke | 381/41 |
| 4,932,062 | 6/1990 | Hamilton | 381/43 |

Primary Examiner—A. D. Pellinen
Assistant Examiner—Brian K. Young
Attorney, Agent, or Firm—Fleit, Jacobson, Cohn, Price, Holman & Stern

[57] ABSTRACT

A sound signal coding method and installation are disclosed, which method, usable particularly for transmitting or storing high quality audio signals in digital form, involves chopping the sound signal into blocks of samples and subjecting the samples of each block to time-frequency transform coding whose coefficients are transmitted in digital form, the reverse operations taking place at reception. At least the most significant coefficients of the transform of each block are subjected to predictive and adaptive coding using the stationary state of the signal over a duration greater than that of a block.

11 Claims, 3 Drawing Sheets

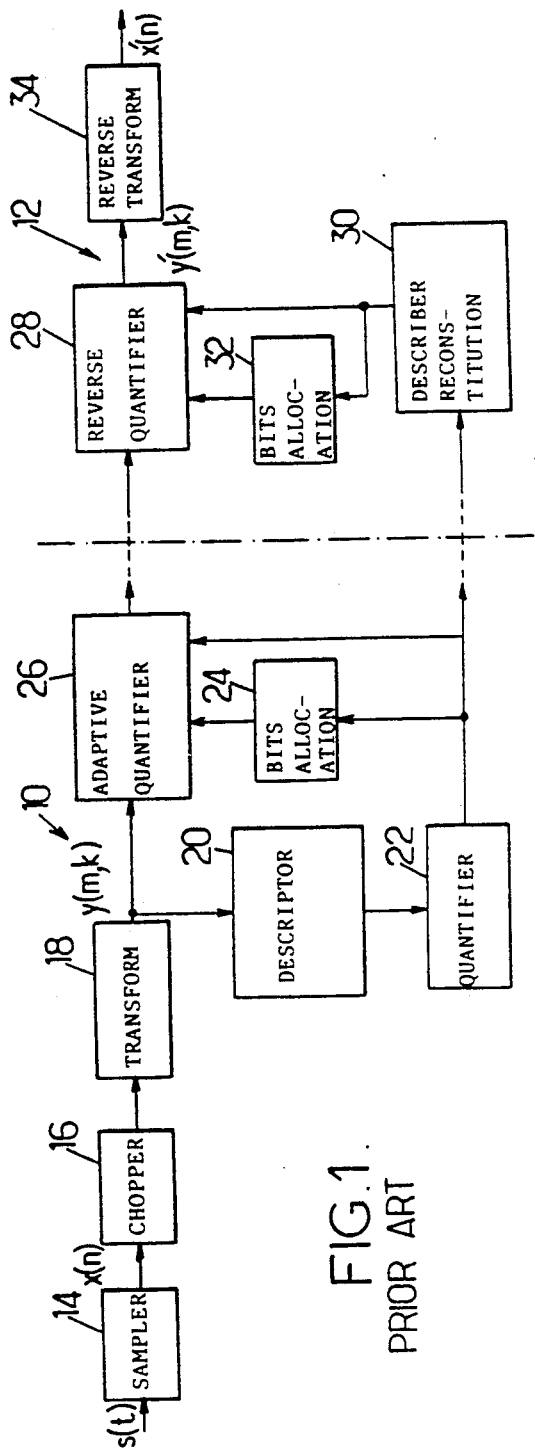
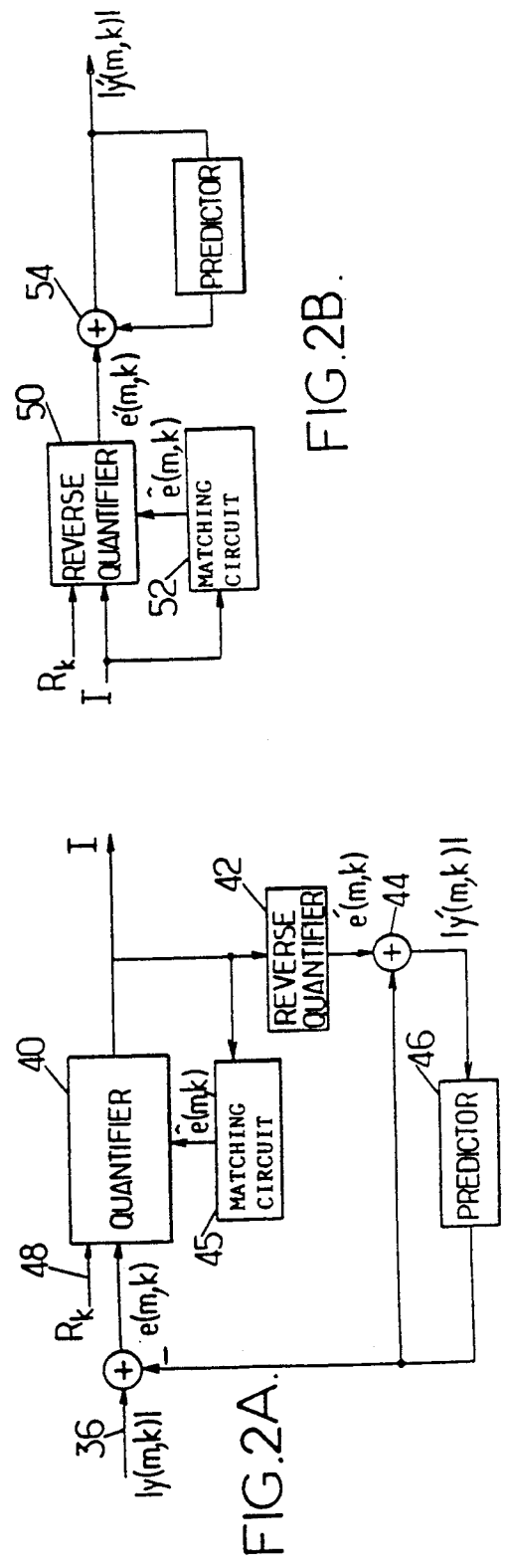
FIG.1. PRIOR ART
FIG.2A.
FIG.2B.

METHOD OF TRANSMITTING OR STORING SOUND SIGNALS IN DIGITAL FORM THROUGH PREDICTIVE AND ADAPTIVE CODING AND INSTALLATION THEREFORE

The invention relates to the transmission or storage of sound signals in digital form, particularly high quality audio signals. It relates more particularly to methods of the type in which the sound signal is chopped up into blocks of samples and the samples of each block are subjected to coding by time-frequency transform whose coefficients are transmitted in digital form, the reverse operations taking place at reception.

Known methods of the above type partially solve the problem of transmitting or storing in digital form high quality sound signals whose bandwidth exceeds 15 kHz and which require, in the case of direct coding in the time field, too high a bit rate. Time-frequency transform coding, particularly using a discrete Fourier transform (DFT) or discrete cosine transform takes advantage of the short term stationary state of many physical signals, and particularly audio signals. In the latter case, the signal formed of digital samples is generally chopped up into blocks of a duration of a few tens of milliseconds (16 or 32 milliseconds in general) and a time-frequency transformation is carried out which gives rise to spectral rays which are coded in their turn by one of the conventional methods adapted to the transmission channel used. The use of a transform reduces the short term redundancy of the variables to be coded and in particular makes it possible to reduce the bit rate required for satisfactory restitution; in fact only the spectral rays corresponding to frequencies in which the energy is concentrated are coded with high accuracy. Thus, the starting signal can be restored with reduced noise.

When the method is applied to the transmission and restitution of high quality audio signals, it provides an additional advantage due to a physico/acoustic phenomenum. Subjectively satisfactory restitution is obtained even if some frequencies, masked by the energy concentrated in the others, are only coded with reduced precision.

The above method, which has been known for a long time and a description of which can be found for example in the article by Zelinsky et al "Adaptive Transform Coding of Speech Signals", IEEE Transactions on Acoustics Speech and Signal Processing, Vol. ASSP-25, No. 4, August 1977, processes each sample block without any reference to the adjacent blocks. The bit rate reduction which it obtains is therefore limited. In fact, for each block it is necessary to transmit not only the coefficients, but also auxiliary information describing the spectrum so that the encoder and decoder have not the same number of bits (i.e. of quantification levels) to the corresponding coefficients; this auxiliary information, which forms a spectrum describer, occupies a significant portion of the available bit rate (15% to 20% in general).

The object of the invention is in particular to provide a method for further reducing the required bit rate. For that, it starts from the recognition that sound signals have, in addition to the short term redundancy which is used in time-frequency transform coding, a very variable medium term redundancy. Thus, in the case of audio signal transmission, the duration of the stationary state of the audio signals is less than 100 ms for very rapid passages and exceeds the second for sustained notes.

This duration is generally greater than the length of the block of samples subjected to the transform. The result is more or less high redundancy between the successive spectra. This redundancy is particularly high for the high energy parts of the spectrum, namely for those requiring the highest coding precision.

In addition, experience shows that the hearing organs are particularly sensitive to the variations of highly resonating sounds, because they seem to get use to a spectral form and are then capable of detecting very small variations in intensity and especially in height. These very small variations must consequently be transmitted and restored exactly, which involves assigning a high number of bits to the corresponding frequencies. But these sustained or highly resonating sounds, to which a large number of bits must be attributed, have precisely a high interblock redundancy which the above-defined method does not take advantage of.

The object of the invention is in particular to provide a transmission method of the above-defined type answering better than those known heretofor the requirements of practice, particularly it that it reduces the required bit rate, for equal restitution quality.

To this end, the invention provides a method in which at least the most significant coefficients of the transform of each block are subjected to predictive and adaptive coding using the stationary state of the signal over a duration greater than that of the block.

In some cases, all the coefficients may be subjected to predictive and adaptive coding. But very often it is preferable to subject only the most significant coefficients of the spectrum to such coding. There are then associated:

predictive and adaptive coding of the intense harmonics of the signals, and coding of the less significant spectral rays of the transform by non-uniform adaptive quantification of the module and fixed and uniform quantification of the phase.

The invention also provides an encoder and decoder, as well as a complete transmission installation, which can be used for implementing the above-defined method.

The predictive and adaptive encoder of the module may have a general conventional construction with an order 1 prediction order and a non-uniform quantifier. The phase encoder may have two differential imbricated loops and a uniform adaptive quantifier.

The invention will be better understood from the following description of a particular embodiment of the invention, given by way of non-limiting example. The description refers to the accompanying drawings, in which:

FIG. 1 is a simplified block diagram of a transmission installation of the prior art, using the time-frequency transform;

FIGS. 2A and 2B are respectively block diagrams of a predictive encoder and decoder of the module of the coefficients, which can be incorporated in the installation of FIG. 1 for implementing the invention;

Figure 3A:
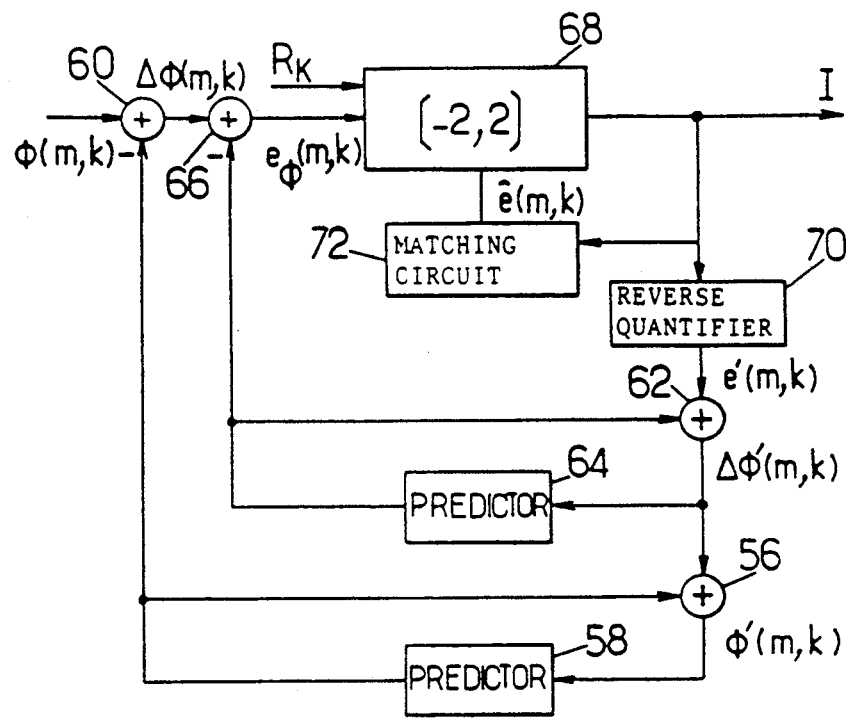
FIGS. 3A and 3B are respectively block diagrams of a predictive encoder and decoder of the phase of the high harmonics, which can also be incorporated in the installation of FIG. 1 for implementing the invention.

Before describing the invention, the construction of the components concerning it in a known type transmission installation will be recalled, using time-frequency transformation coding.

The installation shown schematically in FIG. 1 comprises a transmitter and a receiver, connected together by a transmission channel, not shown, which may be a short wave or wire link. The transmitter contains an encoder 10 which receives the analog input s(t) through a sampler 14. In the case of transmitting high quality audiosignals, a sampling rate of 32 kHz to 48 kHz will generally be used. The encoder comprises a circuit 16 for chopping into blocks which receive the input samples x(n) and distributes them in successive blocks x(n) of order n=0, 1, 2, ... each formed of N samples and of a duration which is generally from 16 to 32 ms in the case of an audio signal. Each block x(n) is subjected independently to time-frequency transformation by a transformation circuit 18 which outputs complex coefficients designated by y(m,k) for the block of order m with k 1, ..., N/2. Each block is processed completely independently of the others.

In what follows, it will be assumed that circuit 18 delivers a discrete Fourier transform (DFT), but other transformations could be used, particularly the discrete cosine transformation (DCT).

The complex coefficients assigned to each block are of the form $$y(m,k) = |y(m,k)| \exp[j \psi(m,k)] \quad (1)$$

where y(m,k) is calculated in accordance with the formula:

$$y(m,k) = \frac{1}{N} \sum_{n=mN}^{(m+1)N-1} x(n) \exp(-j 2\pi kn/N) \quad (2)$$

The modules of the different coefficients represent the frequency distribution of the energy in a block. The long term redundancy of the signal, which appears in formula (2), is not taken into account by the encoder of FIG. 1. So far the phase $\psi(m,k)$ is concerned, the long term stationary state of the signal, i.e. over a time interval exceeding the duration of the block, appears when considering the instantaneous frequency of the signal. It will immediately be apparent when the particular case of a sine wave signal having a frequency f, sampled with a period $T_s$ is considered. The samples x(n) of such a signal are of the form:

$$x(n) = A \cos(2\pi f n T_s + \theta) \quad (3)$$

The phase difference $\Delta\psi(k)$ between a coefficient of order k of the DFT $y(m_1,k)$ calculated over a block of samples of dimension N and the corresponding coefficient $y(m_2,k)$ for a block of the same dimension, offset by M samples with respect to the first one is then:

$$\Delta\psi(k) = \psi(m_2,k) - \psi(m_1,k) = 2\pi f M T_s \quad (4)$$

It can be seen from formula (4) that the time difference of the phases contains an information about the instantaneous frequency f of the sinusoidal signal. The information about the frequency can however only be obtained in a limited deflection range, for the phases $\psi$, and so the difference $\Delta\psi$, are only available modulo $2\pi$. The measurable phase difference is related to the difference between the instantaneous frequency of the signal f and a frequency $f_a$ which depends on the spacing between the blocks by the relation:

$$\Delta\psi(k) = f - f_a$$

in which $1/f_a$ is the integer of periods of the sinusoidal signal during the time $M T_s$.

In the frequent case where the successive blocks are adjacent, i.e. where M=N, $f_a$ is a multiple of the frequency resolution of the DFT.

In the case of a stationary signal, whose spectrum remains practically unchanged during the time, $\Delta\psi$ remains almost constant.

On the other hand, $\Delta\psi$ may have rapid variations in the case of particular audio signals and transitions between signals of different natures.

The prior art encoder shown in FIG. 1 uses adaptive quantification. For that, it comprises an extraction circuit 20 of a describer of the spectrum followed by a quantifier 22, which places the describer in a form constituting auxiliary information transmitted to the decoder of the receiver. The quantified describer is also applied, in the encoder, to a circuit 24 allocating to each coefficient a number of bits which take its amplitude into account. The coefficients y(m,k) of each block are digitized by adaptive quantifiers 26 which code each coefficient with a number of bits fixed by the allocation circuit 24.

The quantified coefficients and the quantified describer are fed to formating means, a modulator and output circuits (not shown).

The receiver comprises input circuits, not shown, which demodulate and distribute the information received, the format of the message being stored in these input circuits. These circuits feed decoder 12 whose construction is symmetrical with that of the encoder. The quantified coefficients are fed to an inverse quantifier 28 whereas the describers are applied to a circuit 30 reconstituting the describer which feeds a circuit 32 allocating bits in a distribution identical to that of the encoder.

From the quantified coefficients received and from the auxiliary information about the spectrum, the reverse quantifier 28 delivers N/2 coefficients y'(m,k). These restored coefficients are applied to a reverse DFT circuit 34 de $DFT^{-1}$ which in its turn restores N samples x'(m) for each block. These N samples reproduce the input samples, except that they are affected by noise due to the quantification and to the transfer function of the transmission channel.

As was seen above, an installation in accordance with the invention comprises additional means using the stationary state of the signal over a longer term than the duration of the block, which results in redundancy of some at least of the coefficients of the transform.

First of all a possible construction will be described of a predictive encoder and decoder of the module of the harmonics (FIGS. 2A and 2B) and of a predictive encoder and decoder of the phase of the harmonics (FIGS. 3A and 3B) before giving a possible overall construction of the installation. In the particular case considered, it will be assumed that coding is of the ADPCM type (adaptive differential pulse coded modulation), but other coding methods could also be used.

PREDICTIVE CODING AND DECODING OF THE MODULE OF THE HARMONICS

The predictive encoder of the module of each coefficient may have the construction shown in FIG. 2A. The module, delivered by the transformation circuit 18, is applied to an adder 36 which also receives the prediction ŷ, delivered by a differential prediction loop, on its subtractive input. The prediction error e(m,k) applied by adder 36 is applied to a quantifier 40 which outputs the prediction error in the form of a binary signal representing a quantification level.

The shown prediction loop comprises an inverse quantifier 42 and an algebraic adder 44. Adder 44 receives the reconstituted error signal e'(m,k) and the output of a predictor 46 fed by the output of adder 44.

As a general rule, the prediction loop will be of order p=1 with a fixed prediction coefficient, a higher prediction order generally giving only a low improvement of the prediction gain.

The output of quantifier 40 is also applied to a matching block 45 which delivers to the quantifier an estimate of the standard deviation ê(m,k).

Quantifier 40 and the matching block 45 may be provided for obtaining matching by the multiplier technique, a description of which is given in "Digital coding of waveforms" by N. Jayant et al, Prentice Hall Signal Processing Series, Editions Oppenheim. The quantifier 4U operates in the following way: for processing block m, the estimated value ê(m,k) is multiplied by a factor which depends on the code word I(m-l,k) transmitted at the output of the multiplier for the block m-1, in accordance with the relation:

$$\hat{e}_m(m,k) = \hat{e}_m(m-1,k) \cdot M\mu(|I(m-1,k)|)$$

The values of $M\mu(|I|)$ are precalculated and stored in tables stored in the matching block 45.

The quantifier is of the non-uniform adaptive type, in accordance with Laplace's law. The number of levels, represented by code words, which it may output varies as a function of m and k, depending on a dynamic allocation of the bits whose number $R_k$ is delivered at an input 48.

In order to put the energy of the error e(m,k) at the output of adder 36 at a minimum, the fixed prediction coefficient of the loop must be equal to the correlation coefficient $\rho$. Experience has shown that $\rho$ is equal to about 0.96 for an audio signal.

If we designate by y'(m-l,k) the module reconstituted from code words I transmitted for the block of order m-1, the equations describing the operation of the predictive encoder of the module are the following:

$$e(m,k) = |y(m,k)| - \rho \cdot |y'(m-1,k)|$$

$$|y'(m,k)| = e'_m(m,k) + \rho \cdot |y'(m-1,k)|$$

in which e'(m,k) designates the output of the inverse quantifier, equal to the error e (m,k) except for the quantification noise.

The predictive decoder of the module contained in the receiver may have the general construction shown in FIG. 2B: the demodulated signal received is applied to an inverse MIC quantifier 50 having a matching circuit 52 identical to that of the encoder. The matching circuit delivers to the inverse quantifier an estimation of the standard deviation ê(m,k). Synthesis of the reconstituted module y'(m,k) is provided by integration of the reconstituted error e'(m,k) in an adder 54 which also receives the output of the prediction loop whose prediction coefficient is the same as that of predictor 46.

PREDICTIVE HARMONIC PHASE ENCODER AND DECODER

The predictive phase encoder (FIG. 3A) has a general construction similar to that of the encoder of FIG. 2A but comprises two differential loops.

The external loop, formed of an algebraic adder 56, a predictor 58 and an adder 60, computes the difference of the phases $\Delta\psi(m,k)$, representative of the frequency according to the above formula (4).

The internal loop, formed of an algebraic adder 62, a predictor 64 and an adder 66 makes it possible to obtain the error eψ. It can be seen that adder 66 receives a signal representative of the frequency, from adder 60, and prediction of the instantaneous frequency delivered by predictor 64.

The prediction is of order 1, in the case of the module encoder. A higher prediction order improves the prediction gain for particular cases only, such as a vibrato. It is therefore generally not justified.

The predication coefficient $\beta$ for the internal loop is theoretically equal to the correlation coefficient: a value $\beta = 0.97$ gives good results. The coefficient $\alpha$ of the external loop is chosen so as to attenuate the effects of transmission errors. A value of 0.98 often gives good results.

the construction of quantifier 68, of the reverse quantifier 70 and of the matching circuit 72 will not be described for it may be the same as that of the module encoder. Matching is again obtained by the multipliers. The quantification may be uniform over a given interval, for example $[-2, +2]$.

Operation of the encoder is represented by the following equations:

$$\begin{aligned}\Delta\phi(m,k) &= \phi(m,k) - \alpha \cdot \phi'(m-1,k) \\ e\phi(m,k) &= \Delta\phi(m,k) - \beta \cdot \Delta\phi'(m-1,k) \\ \Delta\phi'(m,k) &= e'\phi(m,k) + \beta \cdot \Delta\phi'(m-1,k) \\ \phi'(m,k) &= \Delta\phi'(m,k) + \alpha \cdot \phi'(m-1,k)\end{aligned} \quad (7)$$

the transfer function of the decoder as a whole is:

$$H(z) = \frac{z^2}{(z-\alpha) \cdot (z-\beta)} \quad (8)$$

The stability of the decoder is ensured since $\alpha$ and $\beta$ both have an absolute value less than 1.

Figure 3B:
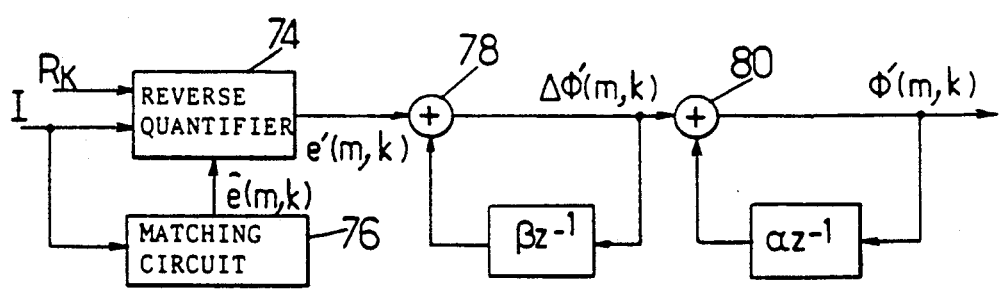

The predicative encoder shown in FIG. 3A must generally be completed by test means (not shown) for detecting phase jumps. In fact, the value of $\psi(m,k)$ is only available modulo $2\Pi$. A phase jump of $+\Pi$ occurs regularly in the case of a periodic signal and results in a pulse on the error eψ(m,k). To make this pulse not breaking the continuity of the phase $\psi(m,k)$ and of the phase difference ($\delta\psi$), a check is necessary.

The test means may compare the absolute value of the error e(m,k) with $\Pi$. If the absolute value exceeds $\Pi$, the means search for one of the three possible values:

$$\begin{aligned}&\Delta\phi(m,k) \\ &\Delta\phi(m,k) + 2\pi\Pi \\ &\Delta\phi(m,k) - 2\pi\Pi\end{aligned}$$

which will minimize the absolute value of the error $e\psi(m,k)$.

The modification brought to $\Delta\psi$ gives to the phase synthesized by adder 56 a module of a value greater than ⊓: the encoder is then reset so as to maintain $\psi'(m,k)$ within the limits $[-\sqcap,+\sqcap]$.

The phase predictive decoder (FIG. 3B) has a construction symmetrical with that of the encoder. It comprises a reverse quantifier 74 with a matching circuit 76, which drives an adder 78 belonging to a prediction loop for reconstituting the phase difference $\Delta\psi$. A second prediction loop, downstream of the first one, comprises an adder 80 which makes it possible to obtain the reconstituted phase $\psi'(m,k)$.

It can be seen that the coded phase $\psi'(m,k)$ is obtained by double integration of the prediction error transmitted in the form of coded words I. Like the encoder, the predictive phase decoder generally comprises means for testing the synthesized phase and resetting (not shown).

For a given quantification precision, the transmission of the words obtained by ADPCM coding of the module or of the phase is due to the high degree of predictability of the coefficients close to the peaks of the frequency spectrum. The prediction gain for the coefficients corresponding to less energetic spectral rays is low. It may even be negative.

In an advantageous embodiment of the invention, predictive coding is only used for the coefficients having a high long term redundancy. That implies previous frequency discrimination. It may be obtained by means of a recursive estimate of the spectrum $|y_e(m,k)|$, given by:

$$|y_e(m,k)| = h_1 \cdot |y_e(m-1,k)| + (1-h_1) \cdot |y'(m-1,k)|$$

and a recursive estimation of the prediction error $e_c(m,k)$, given by:

$$e_c(m,k) = h_1 \cdot e_c(m-1,k) + (1-h_1) \cdot |e'(m-1,k)|$$

where $e'()$ is the prediction error quantified in the preceding block and $h_1$ is a constant between 0 and 1 (for example $h_1 = 0.6$).

The predictable spectral rays are then detected by comparison of the prediction gain $(|y_e(m,k)/e_c(m,k))^2$ with a fixed threshold, chosen so as to provide for example a minimum gain of 1 bit per predicted value.

Since $|ye(m,k)|$ and $e_c(m,k)$ are also known by the decoder, there is no auxiliary information to be transmitted.

Figure 4:
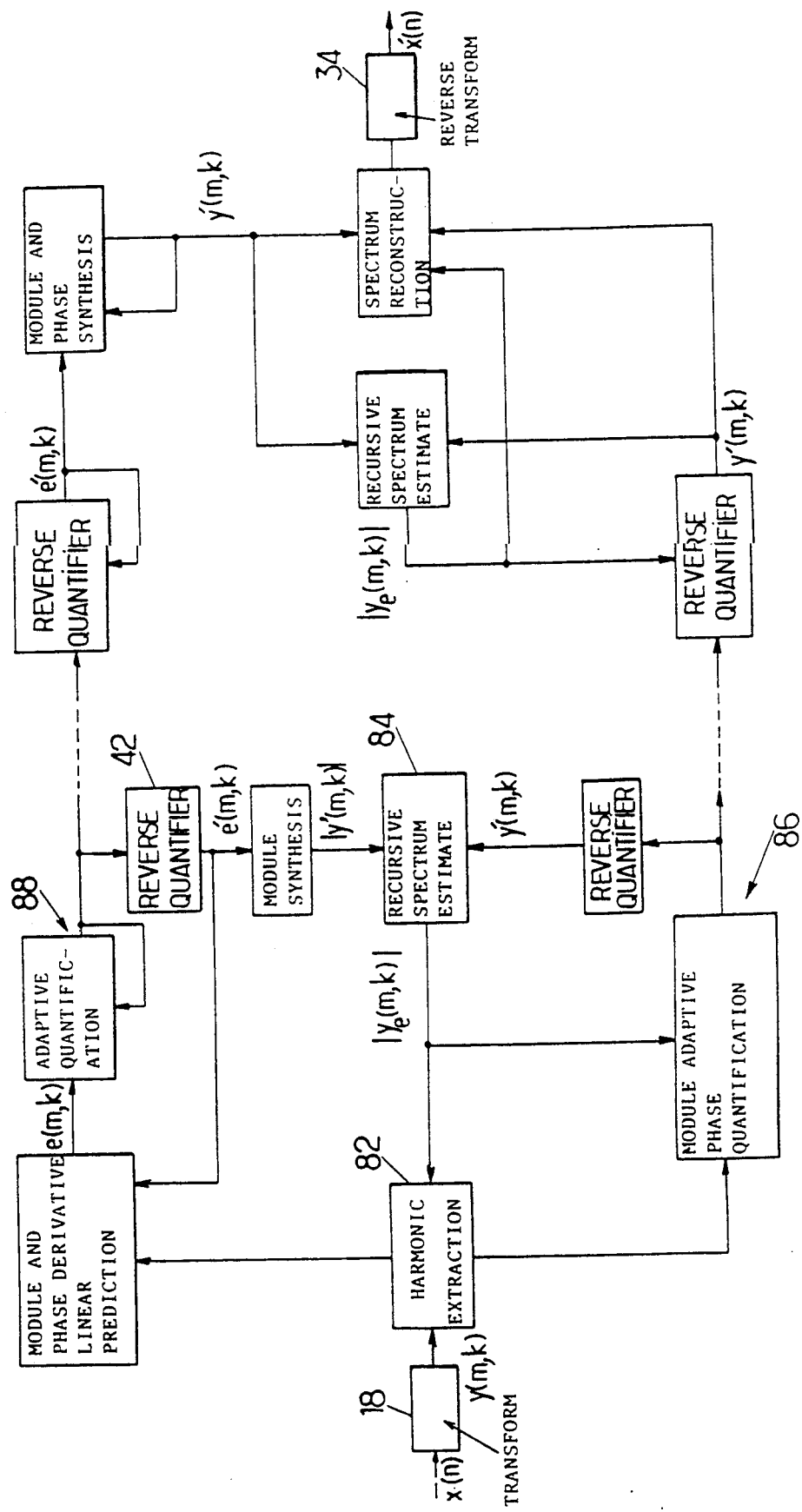
FIG. 4 is a simplified block diagram of an installation in accordance with the invention.

FIG. 4 shows a possible construction of an installation using such frequency discrimination, whose coder (like the decoder) has two branches, only one of which uses predictive coding (or decoding) of ADPCM type. The elements of FIG. 4 corresponding to those already shown in FIGS. 1 to 3 will not be described here and the adders are not illustrated for the sake of greater simplicity.

In the encoder, an harmonic extraction circuit 82 dispatches the coefficients either towards the branch without prediction, or towards the branch with module and phase ADCPM, as a function of the matching signal received from a recursive spectrum estimation circuit 84. This signal is formed by the recursive estimation $|ye(m,k)|$ which it is not necessary to transmit.

In the branch without prediction 86, the phase $\psi(m,k)$ is quantified uniformly over the interval $[\sqcap,\sqcap]$ and the module is quantified adaptatively non uniformly (Laplace's law).

In the prediction branch 88, the predictive coding of the frequency characteristics reduces the bit rate to be allocated to the most significant coefficients of the spectrum and its combination with a looped adaptive or "backward" quantification, leads to a coding algorithm in which the auxiliary information is very much reduced. The gain due to the prediction of certain spectral rays is taken into account in the procedure which allocates the bits to each of the coefficients of the transform. This procedure is computed for each block of samples and its principle complies with the technique described in the article by Zelinski et al "Adaptive Transform Coding of Speech Signals", IEEE Trans. on ASSP, August 1977, and in that by Johnston "Transform Coding of Audio using Perceptual Criteria", IEEE Journal on Selected Areas in Communications, February 1988.

However, for equal importance, the predicted module or phase values receive a slower number of bits. The difference $\Delta R_k$ may be fixed and equal to the mean (or minimum) gain due to the prediction for example $\Delta R_k = 2$ bits.

However, for optimum operation, $\Delta R_k$ is computed as a function of the instantaneous prediction gain for each of the predictable spectral rays. $\Delta R_k$ is then variable in frequency and in time. $\Delta R_k$ may then be obtained from the ratio $(|y_e(m,k)| / e_c(m,k))^2$.

Since the allocation of bits is entirely computed from $|y_e(m,k)|$ and $e_c(m,k)$, there is no auxiliary information to be transmitted.

Different sounds, such as resonating signals or flat spectrum signals, are coded by the same algorithm without requiring previous classification.

We claim:

1. Method of transmitting or storing sound signals in digital form, in which the sound signal is chopped up into blocks of samples and the samples of each block are subjected to time-frequency transform coding the coefficients of which are transmitted in digital form, the reverse operations taking place at reception, wherein at least among the most significant coefficients of said transform of each block only the coefficients having high ling term redundancy are subjected to predictive and adaptive coding using the stationary state of the signal over a duration greater than that of the block.

2. Method according to claim 1, wherein said predictive and adaptive coding is of ADCPM type.

3. Sound signal encoder for implementing the method of transmitting or storing sound signals in digital form, in which the sound signal is chopped up into blocks of samples, the samples of each block being subjected to time-frequency transform coding the coefficients of which are transmitted in digital form and the reverse operations taking place at reception, at least the most significant coefficients of said transform of each block being subjected to predictive and adaptive coding using the stationary state of the signal over a duration greater than that of the block, wherein said encoder comprises, downstream of a time-frequency transformation circuit, means for predictive and adaptive coding of at least some of the coefficients of said transform of each block, said coding means comprising:

a module encoder of a prediction order of at least order 1, having a non-uniform quantifier, and a phase encoder, with prediction at least of order 1 of the instantaneous frequency having a uniform quantifier, a differential external loop for computing the phase difference and an error computing internal loop.

4. Encoder according to claim 3, wherein a module encoder comprises an MIC quantifier, a prediction loop having a reverse quantifier, an algebraic adder relooped via a multiplier multiplying by a prediction coefficient $\rho$ and an input adder of the quantifier, so as to operate in accordance with the equations:

$$e(m,k) = |y(m,k)| - \rho \cdot |y'(m-1,k)|$$

$$|y'(m,k)| = e'_m(m,k) + \rho \cdot |y'(m-1,k)|$$

where e'(m,k) designates the output of the reverse quantifier, equal to the error e (m,k) except for the quantification noise, where y is the value of the module to be coded, y' is the estimated value of y and m is the order number of the block.

5. Encoder according to claim 4 wherein $\rho$ is about 0.96.

6. Encoder according to claim 3, wherein the internal loop of the phase encoder comprises a reverse quantifier, an algebraic adder relooped through a predictor multiplying by a coefficient $\beta$ substantially equal to the correlation coefficient between blocks and an input adder of the quantifier.

7. Encoder according to claim 6, wherein the adding means comprise an algebraic adder, means for carrying out a comparison test of the error with ⊓ and means for resetting the phase so as to maintain it in the range [⊓, +⊓].

8. Encoder according to claim 6, wherein the external loop consists of an algebraic adder, a predictor with a multiplication by a coefficient less than 1 for the error attenuation and adder means.

9. Sound signal decoder for cooperation with the encoder according to claim 3, wherein said decoder comprises, upstream of a frequency-time transformation circuit, decoding means having
   a module decoder whose construction is symmetrical with that of the module encoder, and
   a predictive phase decoder having two prediction loops cascade connected, reconstituting successively the phase difference and the phase.

10. Decoder according to claim 9, wherein said predictive phase decoder comprises adder means having an algebraic adder associated with means for resetting the phase $\psi(m,k)$.

11. Transmission installation comprising a sound signal encoder for implementing a method of transmitting or storing sound signals in digital form, in which the sound signal is chopped up into blocks of samples, the samples of each block being subjected to time-frequency transform coding the coefficients of which are transmitted in digital form and the reverse operations taking place at reception, at least the most significant coefficients of said transform of each block being subjected to predictive and adaptive coding using the stationary state of the signal over a duration greater than that of the block, said encoder comprising downstream of a time-frequency transformation circuit, means for predictive and adaptive coding of at least some of the coefficients of said transform of each block, said coding means comprising a module encoder of a prediction order of at least order 1, having a non-uniform quantifier, and a phase encoder, with a prediction at least of order 1, of the instantaneous frequency having a uniform quantifier, a differential external loop for computing the phase difference and an error computing internal loop wherein said transmission installation comprises an additional branch without predictive adaptive coding and frequency discrimination means with spectrum estimation circuit for dispatching the low energy coefficients towards said branch.

* * * * *